(12) United States Patent
Wang et al.

(10) Patent No.: US 11,853,044 B2
(45) Date of Patent: Dec. 26, 2023

(54) TEST EQUIPMENT AND TEST METHOD OF BATTERY MANAGEMENT SYSTEM

(71) Applicant: Industrial Technology Research Institute, Hsinchu (TW)

(72) Inventors: Yung-Chen Wang, Kaohsiung (TW); Yen-Hsiang Huang, New Taipei (TW); Yi-Ling Lin, Taichung (TW); Yi-Lun Cheng, Taichung (TW); Jia-Wei Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 101 days.

(21) Appl. No.: 17/386,424

(22) Filed: Jul. 27, 2021

(65) Prior Publication Data

US 2022/0034972 A1 Feb. 3, 2022

Related U.S. Application Data

(60) Provisional application No. 63/059,795, filed on Jul. 31, 2020.

(30) Foreign Application Priority Data

Mar. 26, 2021 (TW) .................................. 110111011

(51) Int. Cl.
*G05B 23/02* (2006.01)
*G01R 31/367* (2019.01)
(Continued)

(52) U.S. Cl.
CPC ........... *G05B 23/02* (2013.01); *G01R 31/367* (2019.01); *G01R 35/02* (2013.01);
(Continued)

(58) Field of Classification Search
CPC .. G05B 23/02; G05B 23/0256; G01R 31/367; G01R 35/02; G01R 31/389
See application file for complete search history.

(56) References Cited

U.S. PATENT DOCUMENTS 8,405,398 B2 3/2013 Burkes
8,849,598 B2 9/2014 Mingant et al.
(Continued)

FOREIGN PATENT DOCUMENTS

CN 101762800 A * 6/2010
CN 202153255 U 2/2012
(Continued)

OTHER PUBLICATIONS

Bottiger et al., "Systematic experimental pulse test investigation for parameter identification of an equivalent circuit based on lithium-ion battery" Energy Procedia 135 (2017) 337-346 (Year: 2017).*
(Continued)

*Primary Examiner* — John C Kuan (57) ABSTRACT

Test equipment for a battery management system is provided. A battery-parameter recognition module measures a standard battery to obtain the first correction input, and uses the capacity test formula and the relaxation time test formula to perform a first charge and discharge test on the battery to be tested to obtain first battery parameter. A real-time simulation module determines the battery model and the simulated battery state based on the first battery parameter and the dynamic load. Each simulator of a physical signal simulation module provides a battery physical signal indicating the battery model. A connector provides the battery physical signal to the battery management controller under test. The battery management controller under test provides a stimulated battery state based on the battery physical signal. Master equipment compares the simulated battery
(Continued)

state with an estimated battery state to determine whether the battery management controller under test is normal.

9 Claims, 10 Drawing Sheets

(51) Int. Cl.
 *G01R 31/389* (2019.01)
 *G01R 35/02* (2006.01)
 *H02J 7/00* (2006.01)
(52) U.S. Cl.
 CPC ........ *G05B 23/0256* (2013.01); *H02J 7/0068* (2013.01); *G01R 31/389* (2019.01)

(56) References Cited

U.S. PATENT DOCUMENTS

| | | | |
|---|---|---|---|
| 9,817,074 | B1 | 11/2017 | Li et al. |
| 10,191,116 | B2 | 1/2019 | Aliyev et al. |
| 10,386,422 | B2 | 8/2019 | Christensen et al. |
| 10,664,562 | B2 | 5/2020 | Balasingam et al. |
| 2011/0148424 | A1 | 6/2011 | Chiang et al. |
| 2013/0166235 | A1 | 6/2013 | Oh et al. |
| 2017/0126027 | A1 | 5/2017 | Park |
| 2018/0100896 | A1 | 4/2018 | Hu |
| 2020/0057111 | A1 | 2/2020 | Aubin et al. |
| 2020/0091732 | A1 | 3/2020 | Park |
| 2020/0235441 | A1 | 7/2020 | Rahimian et al. |
| 2021/0011979 | A1* | 1/2021 | MacKay ............... G01R 31/367 |

FOREIGN PATENT DOCUMENTS

| | | | |
|---|---|---|---|
| CN | 102508167 | A | 6/2012 |
| CN | 106681306 | A | 5/2017 |
| CN | 109073713 | A | 12/2018 |
| CN | 208818773 | U * | 5/2019 |
| CN | 110501998 | A * | 11/2019 |
| CN | 110736950 | A * | 1/2020 |
| CN | 109946623 | B | 2/2020 |
| TW | 200613957 | A | 5/2006 |
| TW | 1287313 | B | 9/2007 |
| TW | 201035727 | A | 10/2010 |
| TW | 201122523 | A | 7/2011 |
| TW | 201224485 | A | 6/2012 |
| TW | 201702623 | A | 1/2017 |
| TW | 201939057 | A | 10/2019 |

OTHER PUBLICATIONS

Pavlov et al., "Calibration Module for Battery Management System of Medical Devices" 2019 IEEE Conference of Russian Young Researchers in Electrical and Electronic Engineering (EIConRus) (Year: 2019).*

Machine translation CN-101762800-A downloaded May 2023 (Year: 2023).*
Machine translation CN-208818773-U, downloaded Jun. 2023 (Year: 2023).*
Machine translation CN-110501998-A, downloaded Jun. 2023 (Year: 2023).*
Machine translation CN-110736950-A downloaded Jun. 2023 (Year: 2023).*
Taiwan Patent Office, Notice of Allowance, Patent Application No. 110111011, dated Mar. 26, 2021, Taiwan.
Bui, Truong M.N., et al., "An Advanced Hardware-in-the-Loop Battery Simulation Platform for the Experimental Testing of Battery Management System", 23rd International Conference on Mechatronics Technology (ICMT), Salerno, Italy, 2019, 6 pages, IEEE, US.
Barreras, J.V., et al., "An Advanced HIL Simulation Battery Model for Battery Management System Testing", IEEE Transactions on Industry Application, vol. 52, No. 6, pp. 5086-5099, Nov./Dec. 2016, pp. 5086-5099, IEEE, US.
Thanheiser, Andreas, et al., "Battery emulation considering thermal behavior", IEEE Vehicle Power and Propulsion Conference, Chicago, IL, 2011, 5 pages, IEEE, US.
Buccolini, Luca, et al., "Cell Battery Emulator for Hardware-in-the-Loop BMS Test" IEEE International Conference on Environment and Electrical Engineering and IEEE Industrial and Commercial Power Systems Europe, 2018, 5 pages, IEEE, US.
Fleischer, Christian, et al., "Development of software and strategies for Battery Management System testing on HIL simulator" Eleventh International Conference on Ecological Vehicles and Renewable Energies (EVER), Monte Carlo, 2016, 12 pages, IEEE, US.
Barrearas, Jorge Varela, et al., "Functional analysis of Battery Management Systems using multi-cell HIL simulator", Tenth International Conference on Ecological Vehicles and Renewable Energies (EVER), Monte Carlo, 2015, 10 Pages, IEEE, US.
Shanmugam, Thayalan, et al. "Lithium-Ion Battery Parameter Estimation for HIL, SIL, and MIL Validation" India Matlab Expo, 2018, 17 Pages, Nissan.
Scherler, Soeren and Xiaobo Liu-Henke. "Model-based design of a multi-functional HiL test bench for investigations on a Range Extended Vehicle" IEEE International Systems Engineering Symposium (ISSE), Rome, 2018, 7 pages, IEEE, US.
Schweighofer, Bernhard, et al. "Modeling of high power automotive batteries by the use of an automated test system", IEEE Transactions on Instrumentation and Measurement, vol. 52, No. 4, Aug. 2003, pp. 1087-1091, IEEE, US.
Messie, Pascal, et al., "Multi-Cell Emulation for Battery Management System Validation", IEEE Vehicle Power and Propulsion Conference (VPPC), Chicago, IL, 2018, 6 pages, IEEE, US.
Wang, Hongjie, et al., "Simulink based hardware-in-the-loop rapid prototyping of an electric vehicle battery balancing controller", IEEE 16th Workshop on Control and Modeling for Power Electronics (Compel), Vancouver, BC, 2015, 6 pages, IEEE, US.

* cited by examiner

TEST EQUIPMENT AND TEST METHOD OF BATTERY MANAGEMENT SYSTEM

CROSS REFERENCE TO RELATED APPLICATIONS

This Application claims the benefit of U.S. Provisional Application No. 63/059,795, filed on Jul. 31, 2020, and claims priority of Taiwan Patent Application No. 110111011, filed on Mar. 26, 2021, the entirety of which are incorporated by reference herein.

BACKGROUND OF THE INVENTION

Field of the Invention

The invention is related to test equipment, and more particularly to test equipment of a battery management system.

Description of the Related Art

Batteries are widely used in various electric vehicles, uninterruptible power systems, and related energy storage devices. For example, electric vehicles need to be driven by batteries, so a battery management system (BMS) is also needed to prevent abnormal battery conditions (e.g., battery overcharge/discharge or overheating) to protect electric vehicles and ensure they are safe to drive.

In addition, the battery management system monitors the battery's status to estimate the battery power (state of charge, SOC) and cycle life (state of health, SOH). Due to the variable load when an electric vehicle is driven by the motor, and due to the characteristics and differences of each battery cell, errors may ensue in the estimation of the remaining battery capacity or the cycle life of the battery. Traditionally, it takes a lot of manpower and time to test a battery management system to ensure that the battery management system can work accurately.

Therefore, test equipment and test methods for automatically testing the battery management system are desired, to reduce the cost of such testing.

BRIEF SUMMARY OF THE INVENTION

Test equipment and methods of a battery management system are provided. An embodiment of test equipment of a battery management system is provided. The test equipment includes a battery-parameter recognition module, a real-time simulation module, a physical signal simulation module, a connector coupled between the physical signal simulation module and a battery management controller under test, and master equipment. The battery-parameter recognition module is configured to measure a standard battery to obtain the first correction input, and use the capacity test formula and the relaxation time test formula to perform a first charge and discharge test on the battery to be tested after calibrating a plurality of battery measuring devices using the first correction input, to obtain the first battery parameter of the battery to be tested. The real-time simulation module is configured to obtain a battery model and a simulated battery state according to the first battery parameter and a dynamic load. The physical signal simulation module includes a plurality of simulators. Each of the simulators is configured to provide a battery physical signal according to the battery model. The connector is configured to provide the battery physical signal to the battery management controller under test. The battery management controller under test is configured to provide an estimated battery state of the battery to be tested according to the battery physical signal. The master equipment is configured to provide the dynamic load to the real-time simulation module, and compare the simulated battery state with the estimated battery state to determine whether the battery management controller under test is normal.

Moreover, an embodiment of a test method of a battery management system is provided. A battery management controller under test and a battery to be tested are obtained. A standard battery is measured, to obtain a plurality of measurement parameters. A plurality of test formulas are generated when the measurement parameters match the actual parameters of the standard battery. A charge and discharge test is performed on the battery to be tested according to each of the test formulas. A first battery parameter corresponding to the battery to be tested is generated according to the results of the charge and discharge test. A battery model is generated according to the first battery parameter and a dynamic load corresponding to a test situation. A plurality of physical signals are generated to the battery management controller under test according to the battery model, so as to obtain an estimated battery state corresponding to the battery to be tested from the battery management controller under test. A simulated battery state of the battery to be tested is compared with the estimated battery state provided by the battery management controller under test, to obtain a test result.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
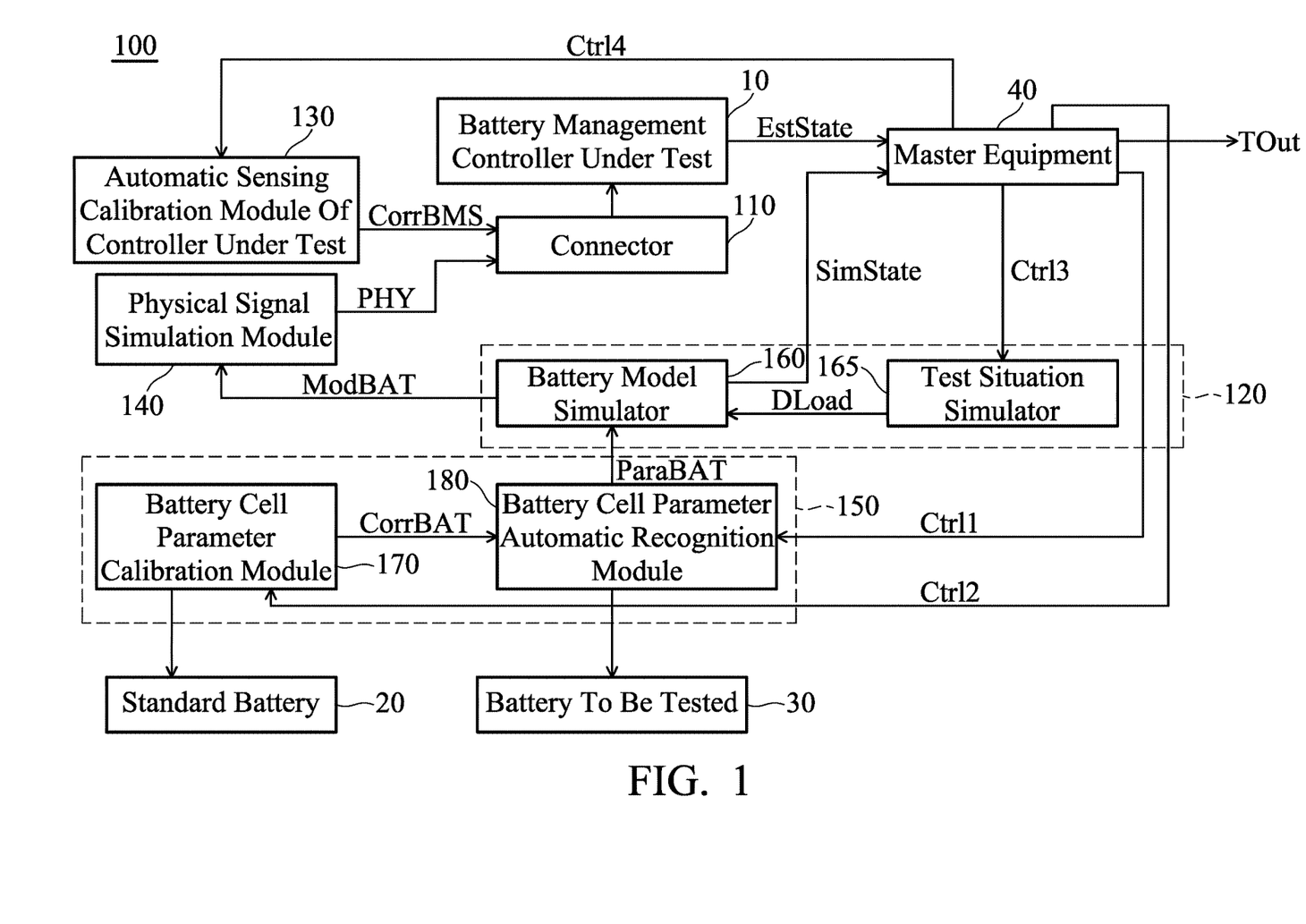
FIG. 1 shows test equipment of a battery management controller according to some embodiments of the invention.

FIG. 1 shows test equipment 100 of a battery management controller 10 according to some embodiments of the invention. The test equipment 100 is configured to test a controller of a battery management system (BMS), hereinafter referred to as the battery management controller under test or the controller under test, to determine whether operation and setting of the battery management controller 10 under test is normal.

In FIG. 1, the test equipment 100 includes master equipment 40, a connector 110, a real-time simulation module 120, an automatic sensing calibration module 130 of the controller under test, a physical signal simulation module 140, and a battery-parameter recognition module 150. In some embodiments, the real-time simulation module 120 includes a battery model simulator 160 and a test situation simulator 165. In some embodiments, the battery-parameter recognition module 150 includes a battery cell parameter calibration module 170 and a battery cell parameter automatic recognition module 180.

The master equipment 40 is configured to respectively provide the control signals Ctrl1, Ctrl2, Ctrl3, and Ctrl4 to the battery cell parameter automatic recognition module 180, the battery cell parameter calibration module 170, the test situation simulator 165, and the automatic sensing calibration module 130 of the controller under test, to set the corresponding operations, such as control flow and parameters. When the user installs the battery 30 to be tested and the battery management controller 10 under test in the test equipment 100, the master equipment 40 is configured to determine whether the estimated battery state EstState of the battery 30 to be tested provided by the battery management controller 10 under test is correct according to the simulated battery status SimState corresponding to the battery 30 to be tested from the battery model simulator 160, and to outputs a test signal Tout to indicate a comparison result of the simulated battery state SimState and the estimated battery state EstState. When the test signal Tout indicates that the difference between the simulated battery state SimState and the estimated battery state EstState is too large, the user needs to modify the battery estimated related settings and operations of the battery management controller 10 under test, so as to match the simulated battery state SimState.

In the test equipment 100, before testing the battery management controller 10, the automatic sensing calibration module 130 of the controller under test is configured to generate a second correction input CorrBMS according to the control signal Ctrl4 from the master equipment 40, and to provide the second correction input CorrBMS to the battery management controller 10 under test through the connector 110, so as to perform an automatic sensing calibration procedure to calibrate the battery management controller 10 under test. Therefore, it can be ensured that the test result of the test equipment 100 will not be affected by the inaccuracy of sensors of the battery management controller 10 under test.

Figure 2:
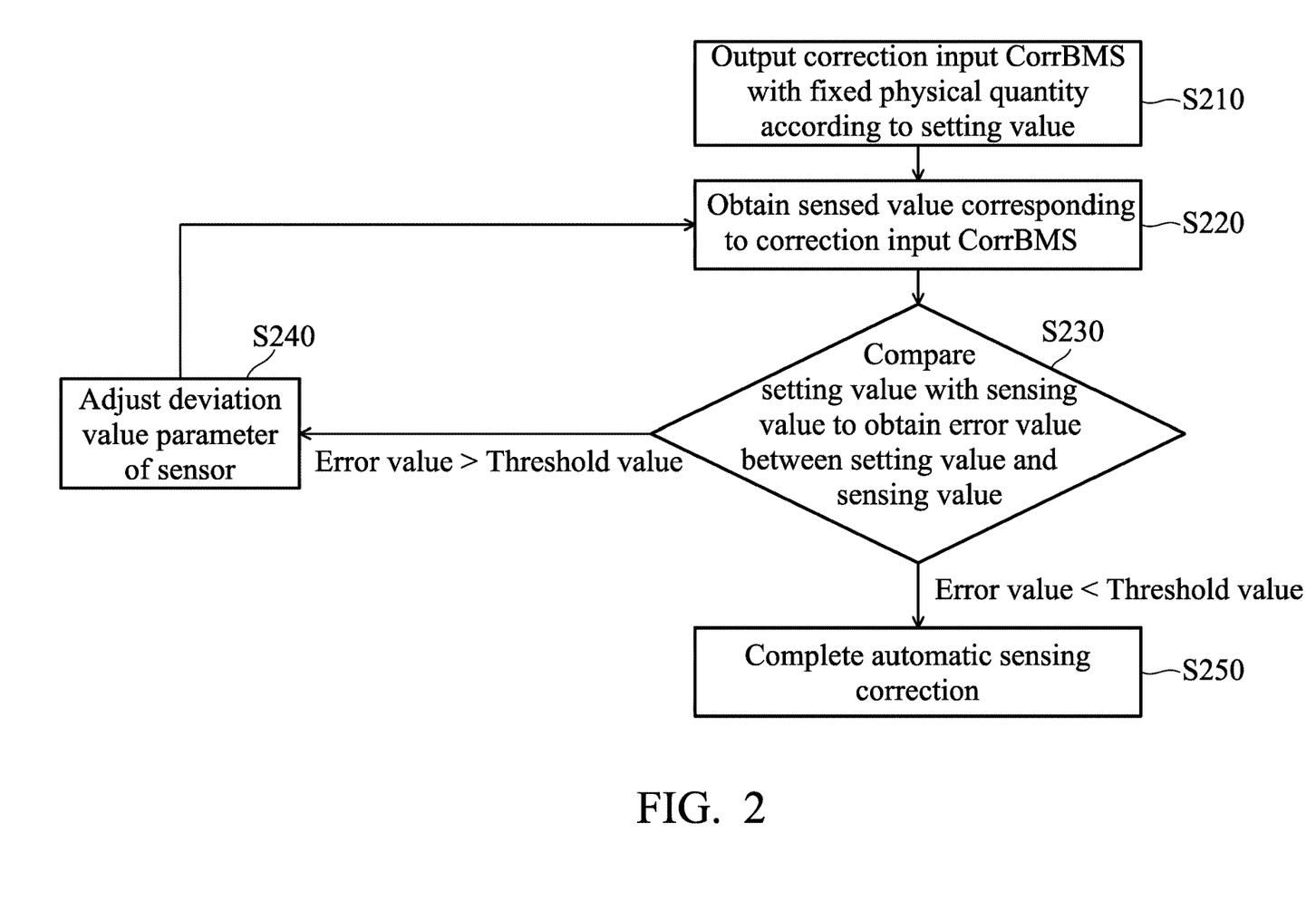
FIG. 2 shows a flowchart of performing an automatic sensing calibration procedure on the battery management controller under test using the automatic sensing calibration module of the controller under test according to some embodiments of the invention.

Referring to FIG. 2, FIG. 2 shows a method of performing an automatic sensing calibration procedure on the battery management controller 10 under test using the automatic sensing calibration module 130 of the controller under test according to some embodiments of the invention. First, in step S210, according to the setting value of the control signal Ctrl4 from the master equipment 40, the automatic sensing calibration module 130 of the controller under test is configured to control the signal simulator (not shown) to output the second correction input CorrBMS with a fixed physical quantity (such as voltage value, current value and/or temperature value) to the battery management controller 10 under test. Next, in step S220, the master equipment 40 is configured to obtain (or read) the sensed value of the second correction input CorrBMS corresponding to the fixed voltage value, the fixed current value and/or the fixed temperature value from the battery management controller 10 under test. Next, in step S230, the master equipment 40 is configured to compare the setting value (the simulated battery state SimState) of the fixed voltage value, the fixed current value and/or the fixed temperature value with the sensing value (the estimated battery State EstState) of the battery management controller 10 under test, and to obtain the error value between the setting value and the sensing value. When the error value exceeds a threshold value, the sensors of the battery management controller 10 under test are adjusted (or corrected), so as to adjust deviation value parameter of the voltage, current and/or temperature sensor (step S240), for example, adjusting the offset of the sensors. After adjusting the sensors, the method returns to step S220, and then the master equipment 40 is configured to obtain the calibrated sensing value from the battery management controller 10 under test, and to compare the setting value with the calibrated sensing value. If the error value between the setting value and the corrected sensing value still exceeds the threshold value, the deviation value parameter of the battery management controller 10 under test is continually adjusted, and steps S220 to S240 of the method are repeated until the error value is below the threshold value (step S250). When the error value is below the threshold value (step S250), the corrected deviation value parameter is obtained, and the automatic sensing correction procedure is completed. In some embodiments, the automatic sensing calibration module 130 of the controller under test is configured to perform the automatic sensing calibration procedure to calibrate the sensors for sensing battery cell voltage, battery pack temperature, battery pack voltage, battery cell current, fan speed and/or insulation resistance.

Referring back to FIG. 1, the test situation simulator 165 is configured to simulate the operating conditions of the battery 30 to be tested according to the control signal Ctrl3 from the master equipment 40, so as to provide a dynamic load DLoad to the battery model simulator 160. In other words, the master equipment 40 is configured to provide the control signal Ctrl3 to set different operating conditions, so that the test situation simulator 165 is configured to provide the corresponding dynamic load DLoad to the battery model simulator 160 according to different situations. Next, the battery model simulator 160 is configured to generate the battery model ModBAT according to the dynamic load DLoad and the first battery parameter ParaBAT from the battery-parameter recognition module 150 and corresponding to the battery 30 to be tested, and then to provide the battery model ModBAT to the physical signal simulation module 140. In the real-time simulation module 120, using the dynamic load DLoad to build the battery model ModBAT, the test coverage of the battery management controller 10 under test is increased. In addition, after receiving the battery model ModBAT, the physical signal simulation module 140 is configured to convert the battery model ModBAT into the actual battery physical signal PHY, and to provide the battery physical signal PHY with various physical quantities to the connector 110.

In FIG. 1, the connector 110 is coupled to the battery management controller 10 under test and between the automatic sensing calibration module 130 of the controller under and the physical signal simulation module 140 for transmitting the second correction input CorrBMS and/or the battery physical signal PHY to the battery management controller 10 under test. In some embodiments, the connector 110 includes an error injector (such as the error injector 112 in FIG. 7A) for injecting an error event into the battery management controller 10 under test for simulating the occurrence of the error event, such as performing the situation that battery management system receives an error signal.

In FIG. 1, the battery cell parameter calibration module 170 is configured to perform a standard test on the standard battery 20 according to the control signal Ctrl2 from the master equipment 40, to perform the battery cell parameter automatic recognition and calibration procedure to generate the first correction input CorrBAT to the battery cell parameter automatic recognition module 180. The standard battery 20 is a standard battery sample (for example, a gold sample). In the battery-parameter recognition module 150, before performing the battery cell parameter automatic recognition and calibration procedure, the battery cell parameter calibration module 170 needs to be used to test the standard battery 20, so that the test result of the standard battery 20 can be used as the calibration basis for the test equipment 100. In addition, in response to the control signal Ctrl1 from the master equipment 40, the battery cell parameter automatic recognition module 180 is configured to test the battery 30 to be tested according to the first correction input CorrBAT, for identifying the battery cell parameters of the battery 30 to be tested. Next, the battery cell parameter automatic recognition module 180 is configured to provide the first battery parameter ParaBAT corresponding to the battery 30 to be tested to the battery model simulator 160 according to the identified battery cell parameter.

Figure 3:
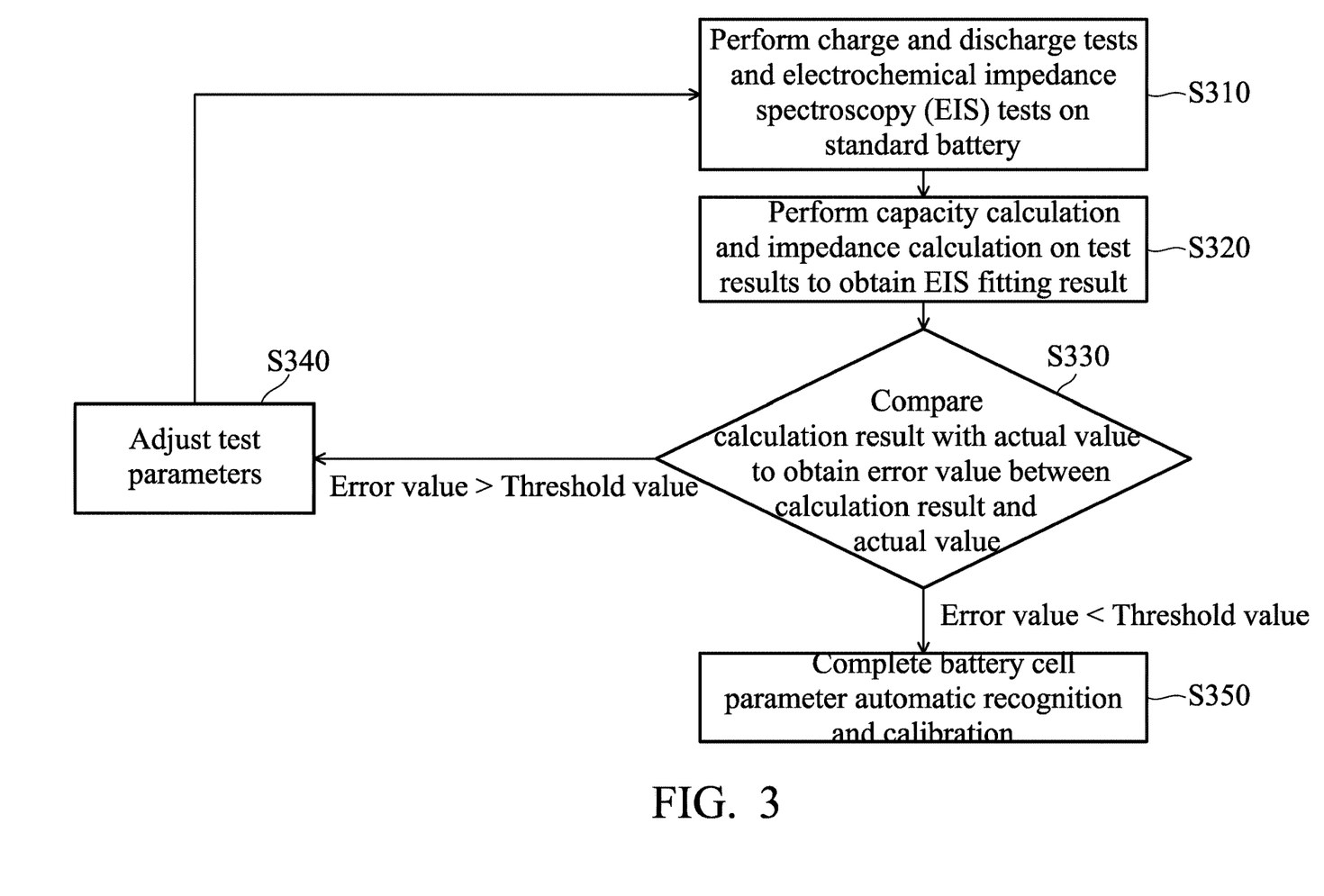
FIG. 3 shows a flowchart of performing a battery cell parameter automatic recognition and calibration procedure using the battery cell parameter calibration module according to some embodiments of the invention.

Referring to FIG. 3, FIG. 3 shows a flowchart of a method for performing a battery cell parameter automatic recognition and calibration procedure using the battery cell parameter calibration module 170 according to some embodiments of the invention. First, in step S310, according to the charge and discharge settings of the control signal Ctrl2 from the master equipment 40, the battery cell parameter calibration module 170 is configured to perform charge and discharge tests and electrochemical impedance spectroscopy (EIS) tests on the standard battery 20. Next, in step S320, the battery cell parameter calibration module 170 is configured to perform capacity calculation and impedance calculation on the test results obtained in step S310, and to obtain the EIS fitting result, that is, the measured parameters of the standard battery 20. Next, in step S330, the battery cell parameter calibration module 170 is configured to compare the calculation result obtained in step S320 with the actual value (or equal to the default value) of the capacity and impedance of the standard battery 20, so as to obtain an error value between the calculation result and the actual value. When the error value exceeds a threshold value, the battery cell parameter calibration module 170 is configured to adjust the test parameters (step S340), for example, adjusts the test parameters of charging and discharging. Next, the method returns to step S310, the battery cell parameter calibration module 170 is configured to perform the charge and discharge tests and the EIS tests on the standard battery 20 again, and to perform the capacity calculation and impedance calculation on the obtained test results again, so as to obtain the EIS fitting results (step S320). Next, the battery cell parameter calibration module 170 is configured to compare the corrected calculation result with the actual value or default value of the capacity and impedance of the standard battery 20 (step S330), so as to obtain the error value between the corrected calculation result and the actual value. If the error value between the corrected calculation result and the actual value still exceeds the threshold value, steps S310 to S340 of the method are repeated until the error value is below the threshold value (step S350). Thus, the battery cell parameter automatic recognition and calibration procedure is completed, and the first correction input CorrBAT is provided to the battery cell parameter automatic recognition module 180.

Figure 4A:
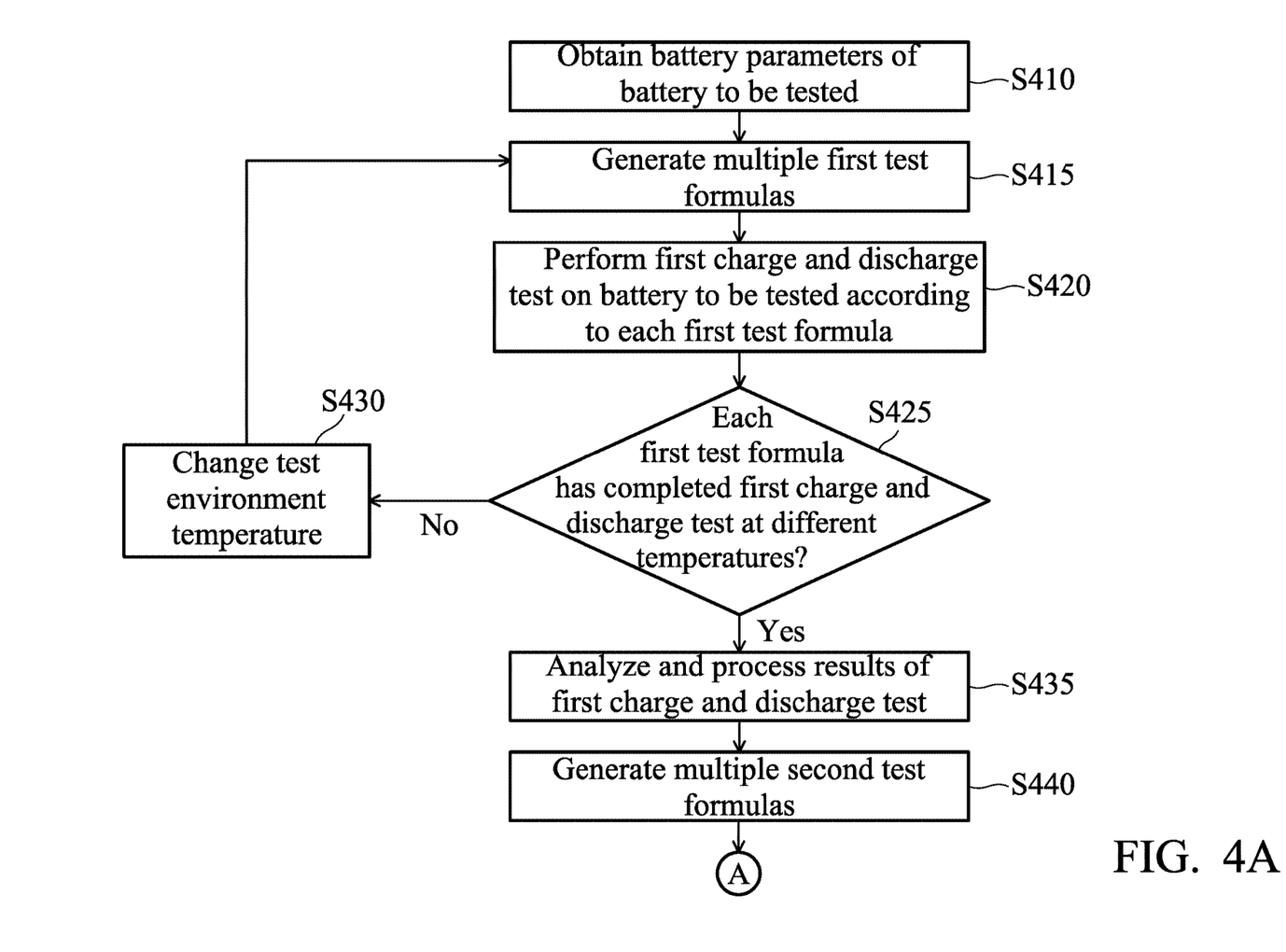
FIGS. 4A and 4B show a flowchart of generating the first battery parameter ParaBAT using the battery cell parameter automatic recognition module according to some embodiments of the invention.
Figure 4B:
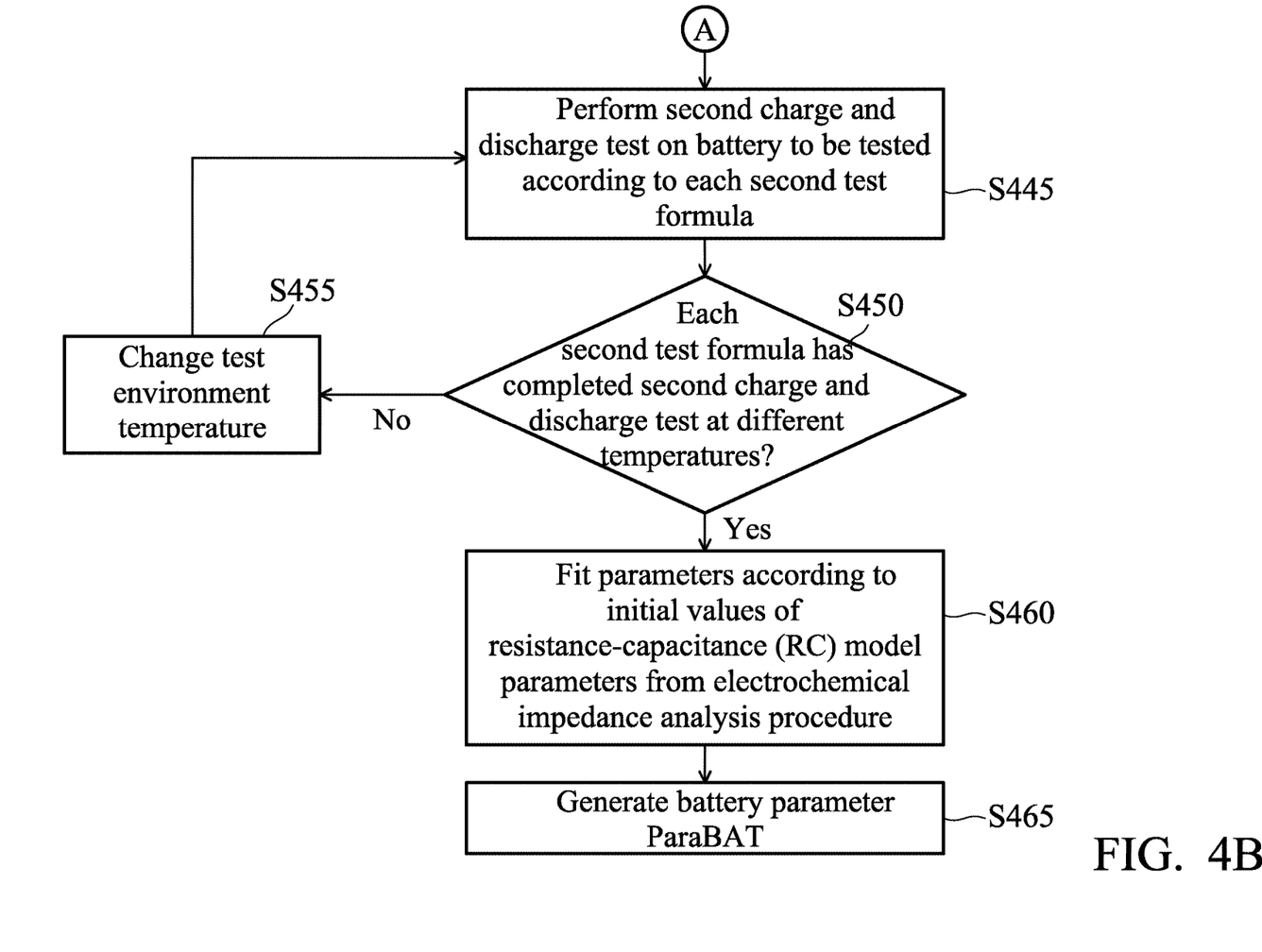

FIGS. 4A and 4B show a flowchart of generating the first battery parameter ParaBAT using the battery cell parameter automatic recognition module 180 according to some embodiments of the invention. First, in step S410, the related second battery parameters (such as battery type, voltage, capacity, etc.) of the battery 30 to be tested provided (or input) by the user are obtained. Next, in step S415, a plurality of first test formulas (e.g., capacity test formula and relaxation time test formula) are generated according to the second battery parameters obtained in step S410. Next, a first charge and discharge test is performed on the battery 30 to be tested according to each first test formula (step S420). In the first charge and discharge test, the battery cell parameter automatic recognition module 180 is configured to measure the battery 30 to be tested in response to the first correction input CorrBAT. Next, in step S425, it is determined whether each first test formula has completed the first charge and discharge test at different temperatures. If it has not been completed, the test environment temperature is changed to a temperature that has not been tested (step S430) until each first test formula has completed the first charge and discharge test at all temperatures. Next, the results of the first charge and discharge test at all temperatures in step S420 (step S435) are analyzed and processed, to generate a plurality of second test formulas (step S440), such as a pulse-charge test formula and a pulse-discharge test formula. Next, a second charge-discharge test is performed on the battery cell 30 to be tested according to each second test formula (step S445). In the second charge and discharge test, the battery cell parameter automatic recognition module 180 is configured to measure the battery 30 to be tested in response to the first correction input CorrBAT. In some embodiments, the pulse charging test formula is used to test the charge voltage responses of the battery cell 30 to be tested at different temperatures, and the pulse-discharge test formula is used to test the discharge voltage responses of the battery cell 30 to be tested at different temperatures. Next, in step S450, it is determined whether each second test formula has completed the second charge and discharge test at different temperatures. If it has not been completed, the test environment temperature is changed to a temperature that has not been tested (step S455), until each second test formula has completed the second charge and discharge test at all temperatures. Next, the results of the second charge-discharge test at all temperatures in step S445 are analyzed and processed, and the values are fitting and optimized according to the initial values of the resistance-capacitance (RC) model parameters (or equivalent model parameters) from the electrochemical impedance analysis procedure (described in FIG. 5) (step S460), so as to generate the first battery parameter ParaBAT (step S465). In some embodiments, the first battery parameter ParaBAT may be a battery model simulated by Simulink.

Figure 5:
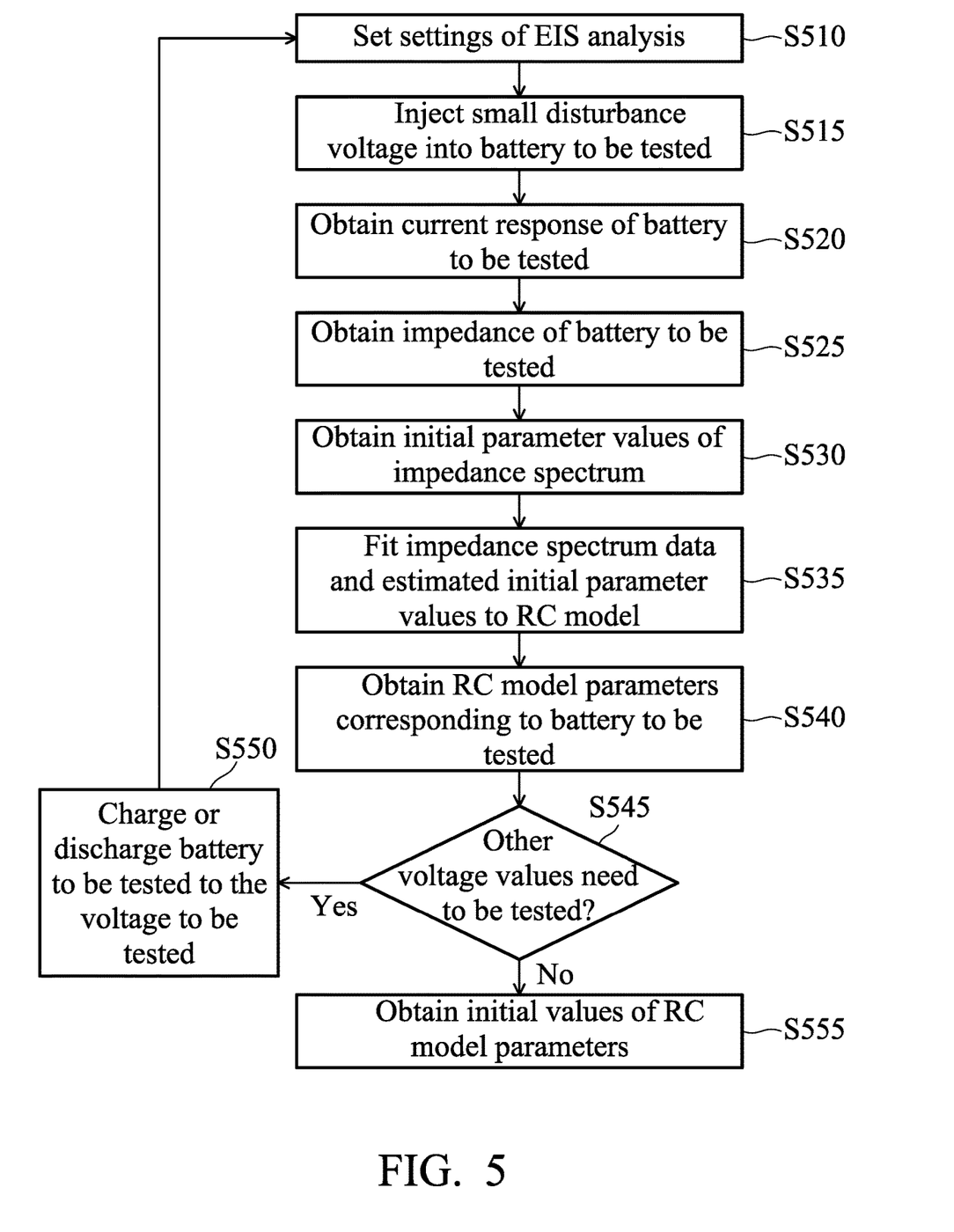
FIG. 5 shows a flowchart of performing the EIS analysis procedure using the battery cell parameter automatic recognition module according to some embodiments of the invention.

FIG. 5 shows a flowchart of performing the EIS analysis procedure using the battery cell parameter automatic recognition module 180 according to some embodiments of the invention. First, in step S510, the settings of the EIS analysis are set, such as the frequency range of the disturbance signal (e.g., 0.1 Hz~10 kHz), the signal size (e.g., 10 mV), the number of sample points, the current voltage of the battery 30 to be tested, and so on. Next, in step S515, a small disturbance voltage is injected into the battery 30 to be tested through the EIS circuit board, so as to measure the battery 30 to be tested according to the first correction input CorrBAT for obtaining the current response of the battery 30 to be tested (step S520). Next, in step S525, the impedance of the battery 30 to be tested is obtained according to the disturbance voltage and the obtained current response. Next, in step S530, a Nyquist plot and a Bode plot of the impedance spectrum are obtained according to the impedance obtained in step S525, to obtain the initial parameter value of the impedance spectrum. Next, in step S535, the impedance spectrum data and the estimated initial parameter values are fitted to the RC model through an algorithm application (such as Matlab), to obtain the RC model parameters corresponding to the battery 30 to be tested (step S540). Next, in step S545, it is determined whether other voltage values need to be tested. If other voltage values need to be tested, the battery 30 to be tested is charged or discharged to the voltage to be tested (step S550), and return to step S510. In other words, the current voltage of the battery 30 to be tested is adjusted to the voltage to be tested, and steps S510-S540 are performed again until there is no voltage to be tested (step S545). Next, in step S555, the EIS analysis procedure is completed, and the initial values of the RC model parameters are obtained. Therefore, the battery cell parameter automatic recognition module 180 is configured to generate the first battery parameter ParaBAT according to the initial value of the RC model parameter.

Figure 6:
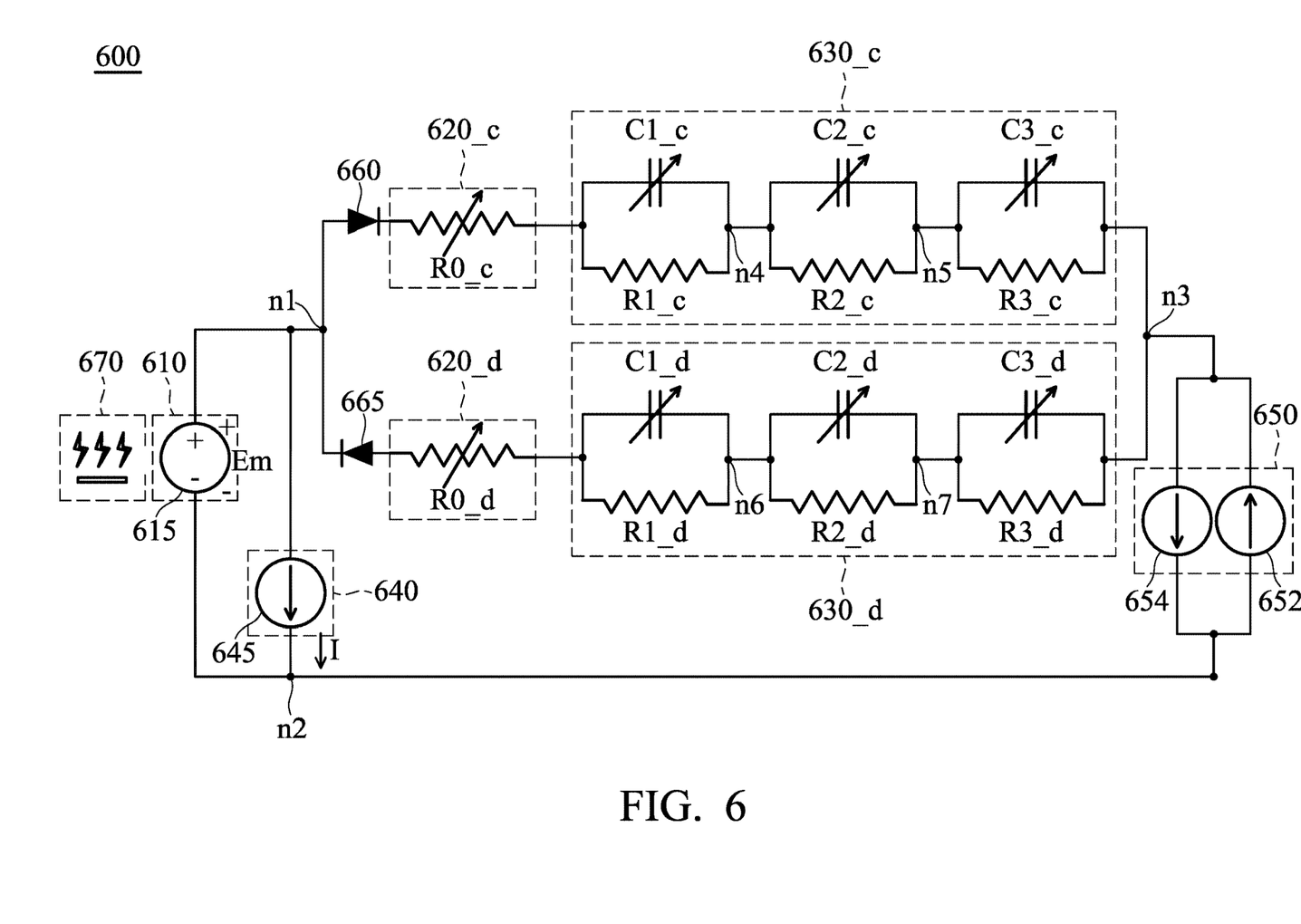
FIG. 6 shows a schematic diagram illustrating an equivalent circuit model of the battery to be tested, which is established by the battery model simulator based on the first battery parameter ParaBAT according to some embodiments of the invention.

FIG. 6 shows a schematic diagram illustrating an equivalent circuit model 600 of the battery 30 to be tested, which is established by the battery model simulator 160 based on the first battery parameter ParaBAT according to some embodiments of the invention. The equivalent circuit model 600 includes an open circuit voltage (OCV) module 610, the internal resistance modules 620_c and 620_d, the RC circuit modules 630_c and 630_d, a self-discharge current module 640, a balance current module 650, and the diodes 660 and 665. In some embodiments, the open circuit voltage module 610 includes a voltage source 615 coupled between the node n1 and the node n2, and is configured to provide a fixed voltage Em. Furthermore, the voltage value of the voltage Em is determined by the battery temperature and the state of charge (SOC). The diode 660 is coupled between the node n1 and the internal resistance module 620_c, and the diode 665 is coupled between the node n1 and the internal resistance module 620_d. The internal resistance module 620_c is coupled between the RC circuit module 630_c and the diode 660, and the internal resistance module 620_d is coupled between the RC circuit module 630_d and the diode 665. The internal resistance module 620_c includes a variable resistor R0_c for providing the equivalent internal impedance during charging. In addition, the internal resistance module 620_d includes a variable resistor R0_d for providing the equivalent internal impedance during discharge. Moreover, the resistance values of the variable resistors R0_c and R0_d are determined by the battery temperature and the state of charge. In some embodiments, the battery temperature is provided by the battery cell thermal module 670. Furthermore, the battery cell thermal module 670 is related to the internal impedance and current of the battery, and the current of the battery is determined by the dynamic load DLoad.

In FIG. 6, the RC circuit module 630_c is coupled between the internal resistance module 620_c and the node n3, and the RC circuit module 630_d is coupled between the internal resistance module 620_d and the node n3. The RC circuit module 630_c includes the variable capacitors C1_c to C3_c and the variable resistors R1_c to R3_c for representing an equivalent RC circuit during charging. In the RC circuit module 630_c, the variable capacitor C1_c and the variable resistor R1_c are connected in parallel between the internal resistance module 620_c and the node n4. Furthermore, the variable capacitor C2_c and the variable resistor R2_c are connected in parallel between the node n4 and the node n5, and the variable capacitor C3_c and the variable resistor R3_c are connected in parallel between the node n5 and the node n3. Similarly, the RC circuit module 630_d includes the variable capacitors C1_c to C3_d and the variable resistors R1_d to R3_d for representing an equivalent RC circuit during discharge. In the RC circuit module 630_d, the variable capacitor C1_d and the variable resistor R1_d are connected in parallel between the internal resistance module 620_d and the node n6. Moreover, the variable capacitor C2_d and the variable resistor R2_d are connected in parallel between the node n6 and the node n7, and the variable capacitor C3_d and the variable resistor R3_d are connected in parallel between the node n7 and the node n3. In FIG. 6, the battery temperature and the power state are determined by the first battery parameter ParaBAT. In some embodiments, the resistance values of the variable resistors R1_c to R3_c and the variable resistors R1_d to R3_d are determined by the battery temperature, the state of charge, and the dynamic load DLoad. Moreover, the capacitance values of the variable capacitors C1_c to C3_c and the variable capacitors C1_d to C3_d are also determined by the battery temperature, the state of charge, and the dynamic load DLoad.

In FIG. 6, the self-discharge current module 640 is coupled between the node n1 and the node n2. The self-discharge current module 640 includes a current source 645 for providing a fixed current I. In addition, the current value of the current I is determined by the battery temperature. The balance current module 650 is coupled between the node n3 and the node n2. The balance current module 650 includes the current sources 652 and 654 for providing currents in different directions. Furthermore, the amount of current of the current sources 652 and 654 is related to the design of the battery management system (BMS). By adjusting the operation of the modules of the equivalent circuit model 600 (such as the internal resistance modules 620_c and 620_d and the resistance-capacitance circuit modules 630_c and 630_d) in response to the dynamic load DLoad, the battery model simulator 160 is configure to generate the battery model ModBAT according to the first battery parameter ParaBAT.

Figure 7A:
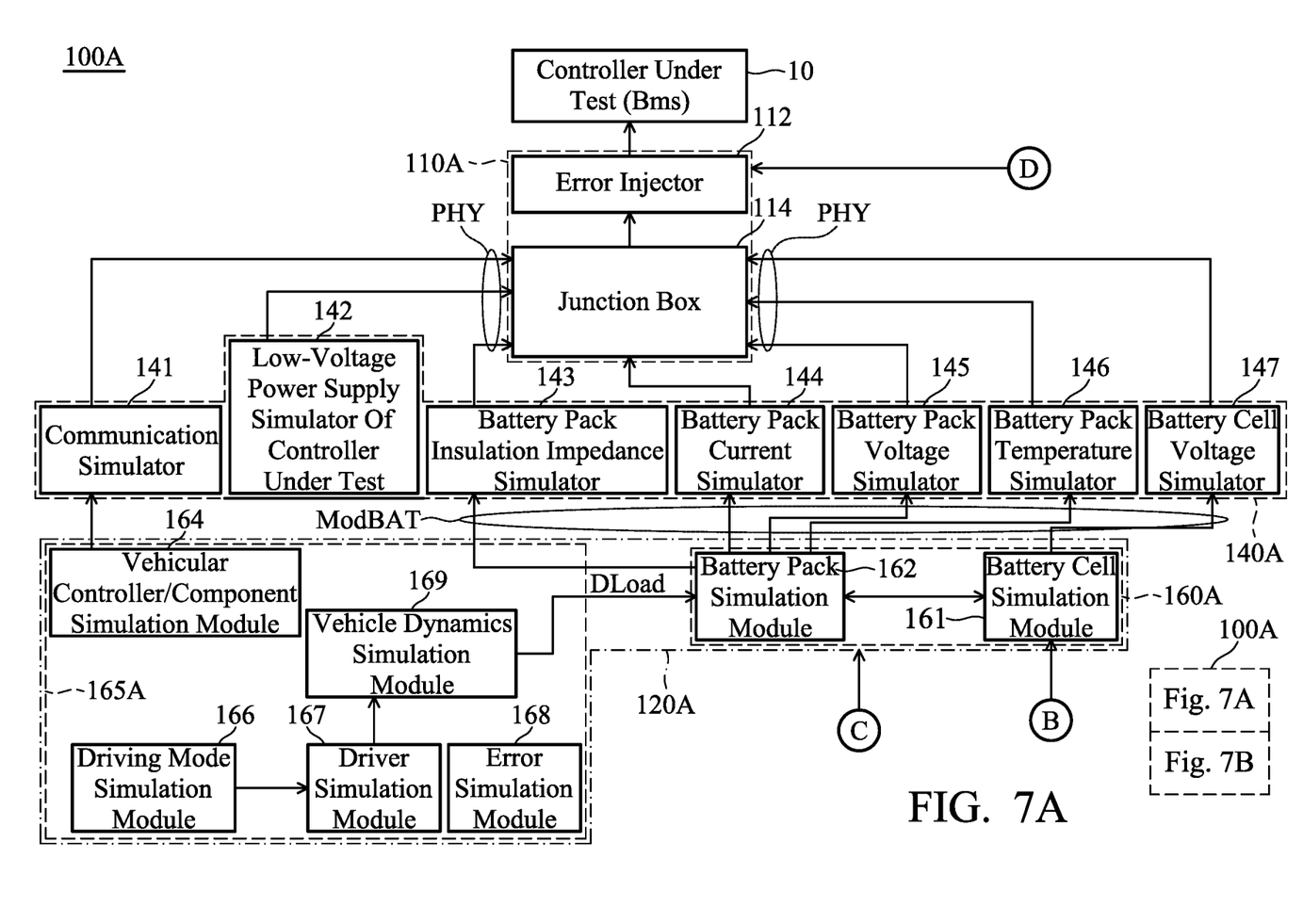
FIGS. 7A and 7B show test equipment of the battery management controller 10 according to another embodiment of the invention.
Figure 7B:
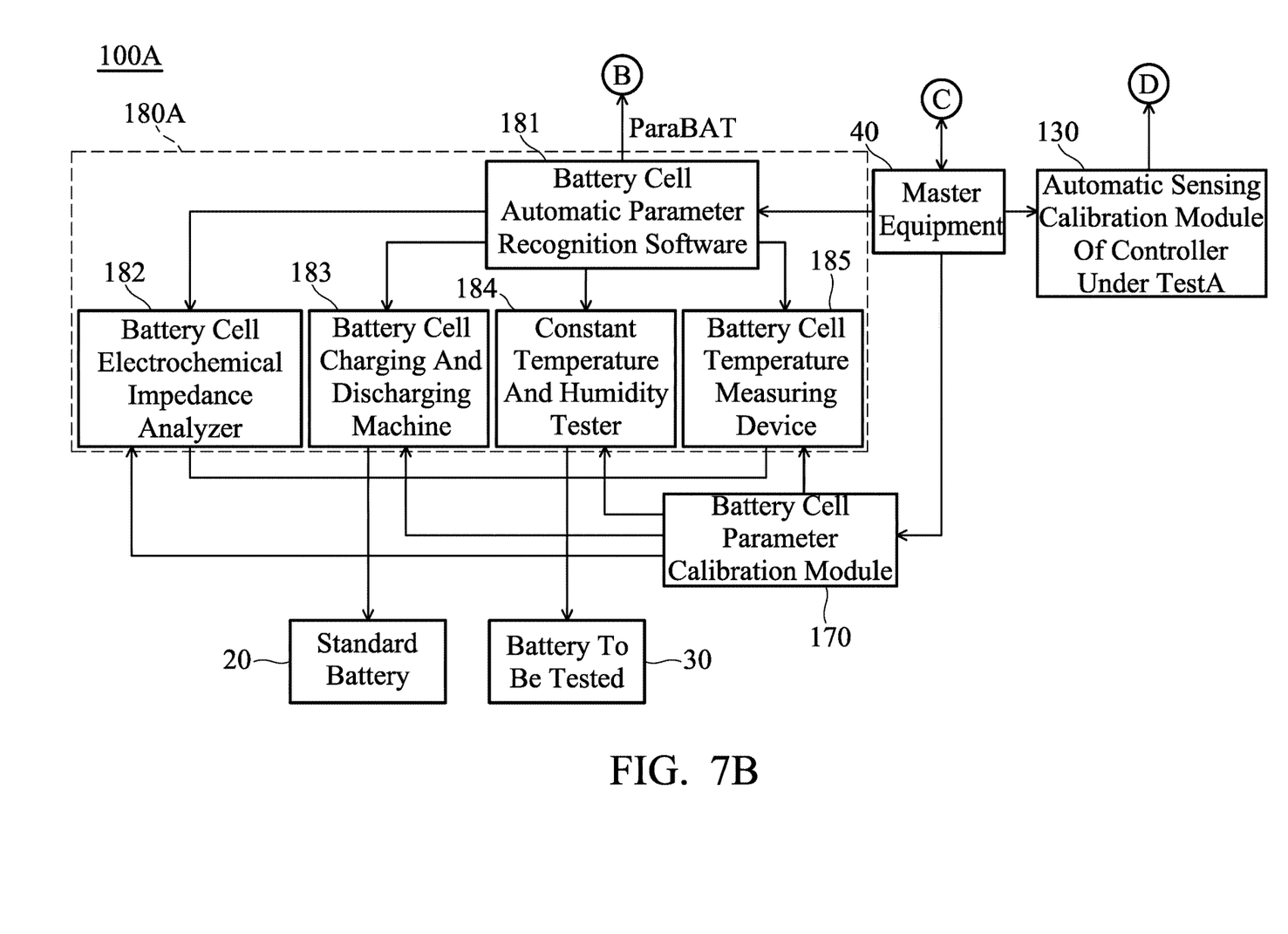

FIGS. 7A and 7B show test equipment 100A of the battery management controller 10 according to another embodiment of the invention. Compared with the test equipment 100 in FIG. 1, the connector 110A, the physical signal simulation module 140A, the battery model simulator 160A, the test situation simulator 165A, and the battery cell parameter automatic recognition module of the test equipment 100A in FIGS. 7A and 7B 180A further includes multiple components. In addition, the battery model simulator 160A and the test situation simulator 165A are included in the real-time simulation module 120A.

In FIGS. 7A and 7B, the connector 110A includes an error injector 112 and a junction box 114. The error injector 112 is coupled between the junction box 114 and the battery management controller 10 under test. The master equipment 40 is configured to control the error injector 112 to input error events to the battery management controller 10 under test. In addition, the junction box 114 is configured to transmit various battery physical signals PHY from each simulator of the physical signal simulation module 140A to the battery management controller 10 under test.

In some embodiments, the physical signal simulation module 140A includes a communication simulator 141, a low-voltage power supply simulator 142 of the controller under test, a battery pack insulation impedance simulator 143, a battery pack current simulator 144, a battery pack voltage simulator 145, a battery pack temperature simulator 146 and a battery cell voltage simulator 147. The communication simulator 141 is configured to simulate the communication between the electronic components (such as automotive components) and the battery management controller 10 under test. The low-voltage power supply simulator 142 of the controller under test is configured to simulate the low-voltage power supply of the battery management controller 10 under test, such as a 12V power supply. The battery pack insulation impedance simulator 143 is configured to simulate the insulation impedance of the battery pack in the battery 30 to be tested. The battery pack current simulator 144 is configured to simulate the current of the battery pack in the battery 30 to be tested. The battery pack voltage simulator 145 is configured to simulate the voltage of the battery pack in the battery 30 to be tested. The battery pack temperature simulator 146 is configured to simulate the temperature of the battery pack in the battery 30 to be tested. The battery cell voltage simulator 147 is configured to simulate the battery cell voltage in the battery 30 to be tested.

In some embodiments, the battery model simulator 160A includes a battery cell simulation module 161 and a battery pack simulation module 162. The battery cell simulation module 161 is configured to dynamically (or automatically) simulate the battery cell state of the battery 30 to be tested according to the first battery parameter ParaBAT from the battery cell parameter automatic recognition module 180A, and to provide the corresponding battery model ModBAT to the battery cell voltage simulator 147. In addition, the battery pack simulation module 162 is configured to dynamically (or automatically) simulate the battery pack state of the battery 30 to be tested according to the first battery parameter ParaBAT provided by the battery cell simulation module 161 and/or the battery cell state of the battery 30 to be tested and the dynamic load DLoad, and to provide the corresponding battery model ModBAT to the battery pack insulation impedance simulator 143, the battery pack current simulator 144, the battery pack voltage simulator 145 and the battery pack temperature simulator 146. In some embodiments, the battery cell simulation module 161 and the battery pack simulation module 162 are mathematical models performed by a processor or a computer.

In some embodiments, the test situation simulator 165A includes a vehicular controller/component simulation module 164, a driving mode simulation module 166, a driver simulation module 167, an error simulation module 168, and a vehicle dynamic simulation module 169. The vehicular controller/component simulation module 164 is configured to provide a simulation model of the necessary controller and vehicle electronic/mechanical components for communicating with the battery management controller 10 under test, so as to control the communication simulator 141. The driving mode simulation module 166 is configured to provide a simulation model of the driving mode of the vehicle. The driver simulation module 167 is configured to provide a simulation model of driver's behavior. The vehicle dynamics simulation module 169 is configured to provide a simulation model of the vehicle dynamics, so as to provide a dynamic load DLoad to the battery model simulator 160A. The error simulation module 168 is configured to provide a simulation model of the error event.

In some embodiments, the battery cell parameter automatic recognition module 180A includes a battery cell automatic parameter recognition software 181 and a plurality of battery measuring devices, wherein the battery measuring devices include a battery cell electrochemical impedance analyzer 182, a battery cell charging and discharging machine 183, a constant temperature and humidity tester 184, and a battery cell temperature measuring device 185. The battery cell automatic parameter recognition software 181 includes a user interface. As described above, the battery cell parameter automatic recognition module 180A is configured to create the test formulas (such as capacity test formula, relaxation time test formula, pulse charging test formula, and pulse discharging test formula) according to the relevant parameters of the test object entered by the user in the user interface, to perform a charge and discharge test on the battery 30 to be tested. The battery cell electrochemical impedance analyzer 182 is configured to analyze the battery cell electrochemical impedance of the battery 30 to be tested. The battery cell charging and discharging machine 183 is configured to perform a charge and discharge test e.g., a first charge and discharge test and a second charge and discharge test) on the battery cells of the battery 30 to be tested. The constant temperature and humidity tester 184 is configured to control the ambient temperature and humidity of the battery cells of the battery 30 to be tested. The battery cell temperature measuring device 185 is configured to measure the surface temperature of the battery cell of the battery 30 to be tested.

Figure 8:
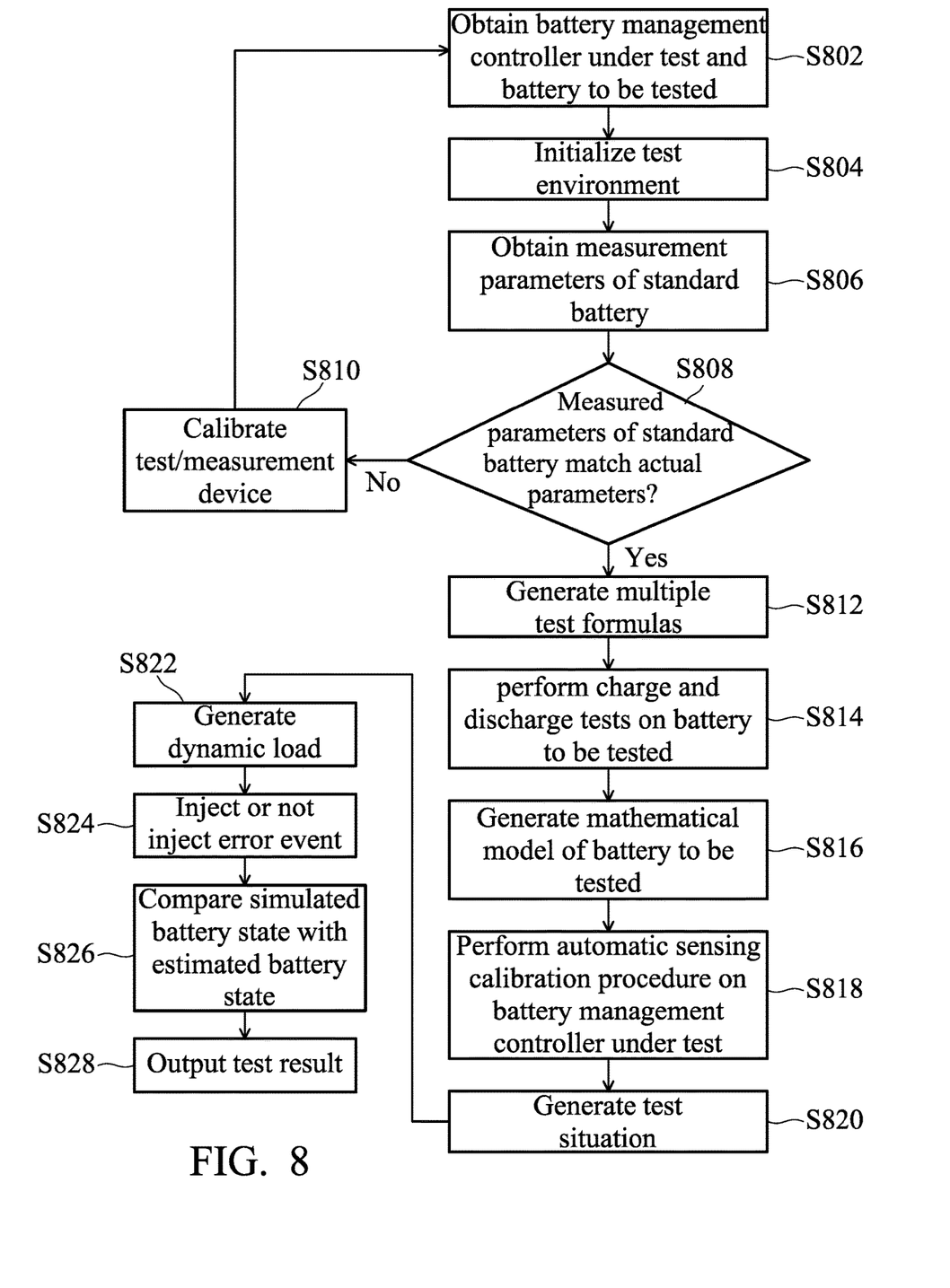
FIG. 8 shows a test method of a battery management control system according to some embodiments of the invention.

FIG. 8 shows a test method of a battery management control system according to some embodiments of the invention. In some embodiments, the test method in FIG. 8 is performed by the test equipment 100 in FIG. 1 or the test equipment 100A in FIGS. 7A and 7B.

Referring to FIG. 1 and FIG. 8 together, in step S802, the battery management controller 10 under test and the battery 30 to be tested are obtained/gotten. In some embodiments, the test method in FIG. 8 is configured to determine whether the battery management controller 10 under test is correct for capacity estimate of the battery 30 to be tested. In step S804, the master equipment 40 is configured to initialize the test environment of the test equipment 100. Next, the master equipment 40 is configured to control the battery cell parameter calibration module 170 to measure the standard battery 20, to obtain the measurement parameters of the standard battery 20 (step S806). As described above, the master equipment 40 is configured to use the battery cell parameter calibration module 170 to perform automatic battery cell parameter recognition and calibration procedures for performing charge and discharge tests and EIS tests on the standard battery 20, so as to obtain the measurement parameters of the standard battery 20 that includes the calculated capacity, calculated impedance and EIS fitting result. Next, in step S808, it is determined whether the measured parameters of the standard battery 20 match the actual parameters of the standard battery 20. If the measured parameter does not match the actual parameter (e.g., the error value between the measured parameter and the actual parameter is greater than the threshold value), the test/measurement devices of the test equipment 100 are calibrated (step S810), and then the method returns to step S804. If the measured parameters match the actual parameters, the battery cell parameter automatic recognition module 180 is configured to generate multiple test formulas (step S812), and perform charge and discharge tests on the battery 30 to be tested according to each test formula (step S814), to generate the first battery parameter ParaBAT, as described in FIGS. 4A and 4B. As described above, the test formulas include a capacity test formula, a relaxation time test formula, a pulse-charge test formula, and a pulse-discharge test formula, and so on. In some embodiments, the charge and discharge test may take several days. After completing the charge and discharge test, the battery model simulator 160 is configured to generate a mathematical model (i.e., the battery model ModBAT) of the battery 30 to be tested according to the first battery parameter ParaBAT obtained from the battery-parameter recognition module 150 and corresponding to the battery 30 to be tested (Step S816). In addition, during or after the mathematical model of the battery 30 to be tested is generated, the automatic sensing calibration module 130 of the controller under test is configured to perform the automatic sensing calibration procedure (as shown in FIG. 2) for calibrating the battery management controller 10 under test (step S818). As described above, the master equipment 40 is configured to compare the setting values of the fixed voltage value, the fixed current value and/or the fixed temperature value with the sensing values of the battery management controller 10 under test, and to obtain the error value between the setting values and the sensing values. If the error value exceeds a threshold value, the sensors of the battery management controller 10 to be tested are adjusted until the error value is below the threshold value. After completing the automatic sensing calibration procedure, the master equipment 40 is configured to control the test situation simulator 165 to generate a test situation (step S820), and to generate the dynamic load DLoad of the battery 30 to be tested according to the test situation (step S822). In some embodiments, the battery model simulator 160 is configured to further adjust the mathematical model of the battery 30 to be tested (i.e., the battery model ModBAT) according to the dynamic load DLoad. In addition, according to the setting of the test situation, the master equipment 40 is configured to control whether to inject an error event (step S824), for example, the error injector 112 in FIG. 7A is used to inject an error event. Next, in step S826, the master equipment 40 is configured to compare the simulated battery state SimState from the battery model simulator 160 with the estimated battery state EstState provided by the battery management controller 10 under test, and to output a test signal Tout for indicating the test result of the simulated battery state SimState and the estimated battery state EstState of the battery 30 to be tested (step S828).

According to the embodiments of the invention, using the automatic sensing calibration module 130 and the battery cell parameter calibration module 170 for automatic calibration and by using the battery cell parameter automatic recognition module 180 and the battery model simulator 160 for automatically establishing a battery model, the test equipment 100 is capable of automatically generating a highly realistic virtual environment for comprehensive test of the battery management controller 10 under test (i.e., the controller of the battery management system). Therefore, compared with the traditional test method, the test equipment 10 can solve the problem that the traditional test system cannot perform quantitative test on the battery management controller 10 under test. Moreover, the test equipment 10 does not need to consume a lot of manpower and time for test pre-processing, so the test cost of the battery management controller 10 under test is decreased and the test time is shortened.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. Test equipment of a battery management system, comprising:
    a battery-parameter recognition module configured to measure a standard battery to obtain a first correction input, and use a capacity test formula and a relaxation time test formula to perform a first charge and discharge test on a battery to be tested after calibrating a plurality of battery measuring devices using the first correction input, to obtain a first battery parameter of the battery to be tested;
    a real-time simulation module configured to obtain a battery model and a simulated battery state according to the first battery parameter and a dynamic load;
    a physical signal simulation module, comprising a plurality of simulators, wherein each of the simulators is configured to provide a battery physical signal according to the battery model;
    a connector coupled between the physical signal simulation module and a battery management controller under test, the connector configured to provide the battery physical signal to the battery management controller under test, wherein the battery management controller under test is configured to provide an estimated battery state of the battery to be tested according to the battery physical signal; and
    master equipment configured to provide the dynamic load to the real-time simulation module and compare the simulated battery state with the estimated battery state to determine whether the battery management controller under test is normal;
    wherein the battery-parameter recognition module is configured to perform an electrochemical impedance analysis on the battery to be tested, to obtain a fitted battery resistance-capacitance model, and further to generate the first battery parameter according to the fitted battery resistance-capacitance model.

2. The test equipment of the battery management system as claimed in claim 1, further comprising:
    an automatic sensing calibration module coupled to the connector and configured to calibrate calibrating the battery management controller under test according to a control signal from the master equipment before the connector provides the battery physical signal to the battery management controller under test.

3. The test equipment of the battery management system as claimed in claim 2, wherein the automatic sensing calibration module is configured to provide a second correction input with a fixed voltage, a fixed current, and a fixed temperature to the battery management controller under test through the connector, and the battery management controller under test is configured to provide a sensing result to the master equipment according to the second correction input.

4. The test equipment of the battery management system as claimed in claim 3, wherein when an error value between a sensing value of the sensing result and the fixed voltage, the fixed current, or the fixed temperature exceeds a threshold value, a sensor of the battery management controller under test is adjusted until the error value is below the threshold value.

5. The test equipment of the battery management system as claimed in claim 1, wherein the connector comprises:
   a junction box coupled between the physical signal simulation module and the battery management controller under test; and
   an error injector coupled between the junction box and the battery management controller under test, the error injector configured to selectively inject an error event into the battery management controller under test according to a control signal from the master equipment.

6. The test equipment of the battery management system as claimed in claim 1, wherein after performing the first charge and discharge test on the battery to be tested by using the capacity test formula and the relaxation time test formula at different environment temperatures, the battery-parameter recognition module is configured to generate a pulse-charge test formula and a pulse-discharge test formula according to a test result of the first charge and discharge test.

7. The test equipment of the battery management system as claimed in claim 6, wherein the battery-parameter recognition module is configured to perform a second charge and discharge test on the battery to be tested with the pulse-charge test formula and the pulse-discharge test formula at the different environment temperatures, and to generate the first battery parameter according to a test result of the second charge and discharge test.

8. The test equipment of the battery management system as claimed in claim 1, wherein the battery measuring devices comprise a battery cell electrochemical impedance analyzer, a battery cell charging and discharging machine, a constant temperature and humidity tester or a battery cell temperature measuring device.

9. The test equipment of the battery management system as claimed in claim 1, wherein the simulators comprise a communication simulator, a low-voltage power supply simulator, a battery pack insulation impedance simulator, a battery pack current simulator, a battery pack voltage simulator, a battery pack temperature simulator or a battery cell voltage simulator.

\* \* \* \* \*